(12) United States Patent
Okada

(10) Patent No.: US 10,727,646 B2
(45) Date of Patent: Jul. 28, 2020

(54) SWEEPING SIGNAL GENERATING DEVICE

(71) Applicant: YOKOGAWA ELECTRIC CORPORATION, Tokyo (JP)

(72) Inventor: Masanori Okada, Tokyo (JP)

(73) Assignee: YOKOGAWA ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/440,566

(22) Filed: Jun. 13, 2019

(65) Prior Publication Data

US 2020/0006918 A1    Jan. 2, 2020

(30) Foreign Application Priority Data

Jun. 28, 2018  (JP) ................ 2018-123373

(51) Int. Cl.
*H01S 3/10*  (2006.01)
*H01S 5/068*  (2006.01)
*H01S 5/026*  (2006.01)

(52) U.S. Cl.
CPC ........ *H01S 5/06817* (2013.01); *H01S 5/0261* (2013.01); *H01S 5/0265* (2013.01); *H01S 5/06804* (2013.01); *H01S 5/06808* (2013.01); *H01S 5/06821* (2013.01); *H01S 5/06825* (2013.01)

(58) Field of Classification Search
CPC ............ H01S 5/06817; H01S 5/06808; H01S 5/06804; H01S 5/06821; H01S 5/06825; H01S 5/0261; H01S 5/0265
See application file for complete search history.

(56) References Cited

U.S. PATENT DOCUMENTS

| | | | |
|---|---|---|---|
| 2014/0174280 A1* | 6/2014 | Nishigori | G10H 1/38 84/622 |
| 2016/0084757 A1* | 3/2016 | Miron | G01N 21/031 356/437 |
| 2016/0305870 A1* | 10/2016 | Ooyama | G01N 21/3518 |
| 2019/0097385 A1* | 3/2019 | Blauvelt | H01S 5/06832 |
| 2019/0101491 A1* | 4/2019 | Shibuya | G01J 3/10 |

FOREIGN PATENT DOCUMENTS

| | | |
|---|---|---|
| EP | 2133686 A1 | 12/2009 |
| JP | S57-99046 A | 6/1982 |
| JP | 2010-177328 A | 8/2010 |

* cited by examiner

*Primary Examiner* — Kinam Park
(74) *Attorney, Agent, or Firm* — Osha Liang LLP

(57) ABSTRACT

A sweeping signal generating device includes a first converter that outputs a sweeping signal having a first offset value added to or subtracted from a sweeping standard level, a second converter that outputs an offset signal having a second offset value corresponding to the first offset value, and an adder circuit that adds the sweeping signal output from the first converter and the offset signal output from the second converter.

12 Claims, 7 Drawing Sheets

SWEEPING SIGNAL GENERATING DEVICE

CROSS-REFERENCE TO RELATED APPLICATIONS

This application is based on and claims priority under 35 U.S.C. § 119 to Japanese Patent Application No. 2018-123373 filed on Jun. 28, 2018, the contents of which are incorporated herein by reference.

BACKGROUND

Technical Field

One or more embodiments of the present invention generally relate to a sweeping signal generating device.

Related Art

Conventional technologies of sweeping an oscillation wavelength of a laser to become a light source are known for spectroscopically acquiring information related to a measurement subject based on an optical spectrum such as an optical absorption spectrum.

For example, patent literature 1 discloses a wavelength sweeping light source that can continuously sweep a prescribed wavelength range without a mode hop using a Littman external resonator semiconductor laser.
Patent Literature 1: Japanese Patent Application Publication No. 2010-177328

When using such repeated sweeping signals, a digital signal of a fixed pattern is output from a control unit such as, for example, a laser controller, and is converted using a converter such as a digital to analog (D/A) converter to generate a sweeping signal. At this time, fixed nonlinear noise is superimposed on the generated sweeping signal, and measuring accuracy may decrease because the noise caused by such nonlinear noise is also superimposed on information relating to a measurement subject. The wavelength sweeping light source described in patent literature 1 does not prevent degradation of measuring accuracy.

SUMMARY

One or more embodiments provide a sweeping signal generating device that can change nonlinear noise superimposed on a sweeping signal.

A sweeping signal generating device according to one or more embodiments is provided with a first output unit that outputs a sweeping signal having a first offset value added to or subtracted from a sweeping standard level, a second output unit that outputs an offset signal having a second offset value corresponding to the first offset value, and an adding unit for adding the sweeping signal output from the first output unit and the offset signal output from the second output unit. According to such a sweeping signal generating device, nonlinear noise superimposed on a sweeping signal can be changed in the first output unit by displacing the sweeping signal by the amount of the first offset value from the sweeping standard level. Therefore, the sweeping signal generating device can generate a sweeping signal that can contribute to the reduction of noise superimposed on information relating to a measurement subject such as, for example, an optical spectrum.

In the sweeping signal generating device according to one or more embodiments, the first output unit may output sweeping signals having a different first offset value for each cycle over a plurality of cycles, and the second output unit may output offset signals having a second offset value such as one that is the same as the standard level when added to the first offset value for each cycle across a plurality of cycles. Therefore, nonlinear noise superimposed on a sweeping signal can be changed across a plurality of cycles. That is, the pattern of nonlinear noise is different for each cycle. Therefore, nonlinear noise acts like random noise, so the nonlinear noise in each cycle is mutually negated when such nonlinear noise is averaged across all cycles. The sweeping signal generating device can generate a sweeping signal that can contribute to further reductions of noise superimposed on information relating to a measurement subject such as, for example, an optical spectrum.

In the sweeping signal generating device according to one or more embodiments, a difference between the first offset value in one cycle and the first offset value in a cycle following this one cycle may be constant across a plurality of cycles. Therefore, the sweeping signal generating device can simply and easily control the first output unit because it is possible to uniformly change the first offset value based on a fixed difference.

In the sweeping signal generating device according to one or more embodiments, a control unit is further provided that determines the first offset value and the second offset value so that nonlinearity of the sweeping signal caused by nonlinear noise superimposed on the sweeping signal is smaller than nonlinearity when at the standard level, wherein: the first output unit may output the sweeping signal having the first offset value determined by the control unit across one or more cycle, and the second output unit may output the offset signal having the second offset value determined by the control unit across one or more cycle. Therefore, the sweeping signal generating device can generate a sweeping signal having nonlinear noise reduced further than with a sweeping signal in the standard level. Therefore, the sweeping signal generating device can generate a sweeping signal that can contribute to the reduction of noise superimposed on information relating to a measurement subject such as, for example, an optical spectrum.

In the sweeping signal generating device according one or more embodiments, the sweeping signal may include sweep voltage, the offset signal may include constant voltage, and the added voltage of the sweep voltage and constant voltage output from the adding unit may be used for sweeping a wavelength of a light source. Therefore, the sweeping signal generating device can sweep the wavelength of any light source.

In the sweeping signal generating device according to one or more embodiments, a converter may be further provided for converting the added voltage into injected current for sweeping an oscillation wavelength of a laser. Therefore, the sweeping signal generating device can sweep the oscillation wavelength by changing the injected current of a laser. Therefore, the sweeping signal generating device can generate a sweeping signal that can contribute to the reduction of noise superimposed on an optical spectrum.

In one or more embodiments, a sweeping signal generating device includes a first converter that outputs a sweeping signal having a first offset value added to or subtracted from a sweeping standard level, a second converter that outputs an offset signal having a second offset value corresponding to the first offset value, and an adder circuit that adds the sweeping signal output from the first converter and the offset signal output from the second converter.

According to one or more embodiments, it is possible to provide a sweeping signal generating device that can change nonlinear noise superimposed on a sweeping signal.

DETAILED DESCRIPTION

Embodiments of the present invention will be described herein with reference to the drawings. Those skilled in the art will recognize that many alternative embodiments can be accomplished using the teaching of the present invention and that the present invention is not limited to the embodiments illustrated herein for explanatory purposes.

For example, a laser gas analyzer is directly attached to a flow path in which measured gas such as a process gas flows, and a component concentration analysis of a measurement subject is carried out. For example, gas molecules such as CO (carbon monoxide), $CO_2$ (carbon dioxide), $H_2O$ (water), CnHm (hydrocarbon), $NH_3$ (ammonia), and $O_2$ (oxygen) are included as measured gasses. Piping, a gas duct, a combustion furnace, and the like are included as the flow path.

For example, a TDLAS (tunable diode laser absorption spectroscopy) laser gas analyzer is included as such a laser gas analyzer. TDLAS laser gas analyzers analyze the component concentration of a measurement subject by, for example, irradiating laser light in a measured gas.

The gas molecules included in the measured gas indicate an optical absorption spectrum based on the oscillation and rotational energy transfer of molecules from infrared to the near-infrared region. The optical absorption spectrum is peculiar to the component molecules. The absorption of gas molecules relating to laser light is proportional to the component concentration and optical path length due to the Lambert-Beer law. It therefore becomes possible to analyze the component concentration of a measurement subject by measuring the intensity of the optical absorption spectrum.

With TDLAS, a semiconductor laser light having a sufficiently narrower linewidth than the absorption linewidth of the energy transfer of the gas molecules is irradiated to the measured gas. The oscillation wavelength is swept by carrying out high speed modulation on the injected current of the semiconductor laser. The light intensity of the semiconductor laser light that has passed through the measured gas is measured, and one individual optical absorption spectrum is measured.

The sweep range of the semiconductor laser light differs depending on the use thereof. When the measurement subject is $O_2$, the linewidth of the semiconductor laser light is, for example, 0.0002 nm, and the sweep width is, for example, 0.1 to 0.2 nm. The measurement of optical absorption spectrum is carried out by sweeping a sweep width of 0.1 to 0.2 nm. The component concentration of a measurement subject is found by carrying out a concentration conversion from the one acquired optical absorption spectrum. Well-known methods such as the peak height method, spectrum area method, and 2f method are included as the method of concentration conversion.

Figure 4:
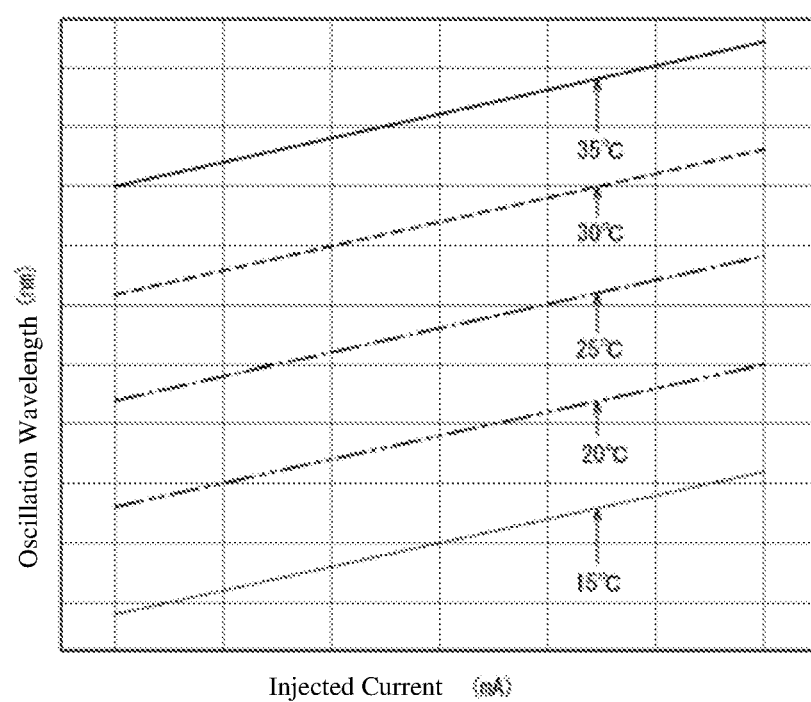
FIG. 4 is a schematic diagram illustrating an example of the relationship between the injected current and oscillation wavelength of a semiconductor laser.
Figure 5A:
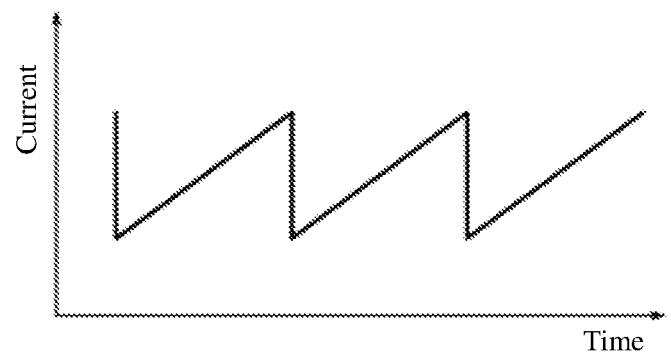
FIG. 5A is a schematic diagram illustrating the injected current of a swept semiconductor laser.
Figure 5B:
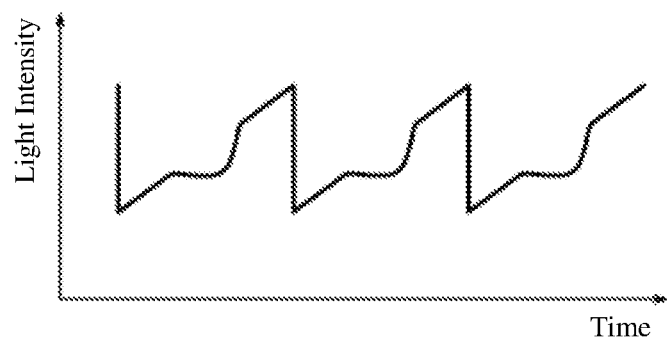
FIG. 5B is a schematic diagram illustrating change in light intensity of semiconductor laser light that has passed through measured gas.
Figure 5C:
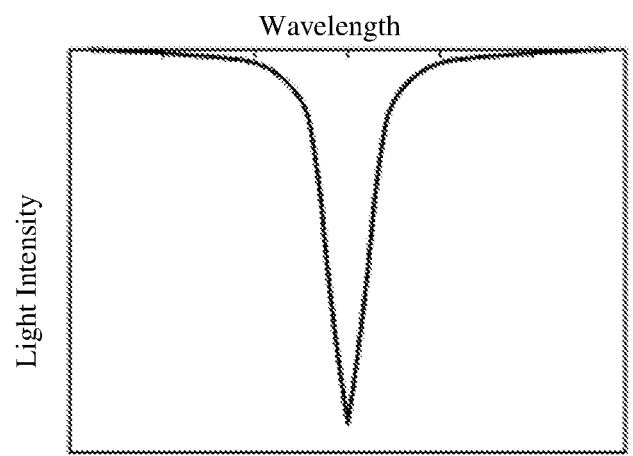
FIG. 5C is a schematic diagram illustrating an optical absorption spectrum of measured gas.

FIG. 4 is a schematic diagram illustrating an example of the relationship between the injected current and oscillation wavelength of a semiconductor laser. FIG. 5A is a schematic diagram illustrating the injected current of a swept semiconductor laser. FIG. 5B is a schematic diagram illustrating change in light intensity of semiconductor laser light that has passed through measured gas. FIG. 5C is a schematic diagram illustrating an optical absorption spectrum of measured gas. The conventional method for sweeping an oscillation wavelength of a semiconductor laser and measuring the optical absorption spectrum of measured gas will be described referring to FIG. 4 and FIG. 5A to FIG. 5C.

As illustrated in FIG. 4, the oscillation wavelength of a semiconductor laser generally depends on the injected current and temperature of the semiconductor laser. For example, the higher the injected current, the longer the oscillation wavelength. For example, the more the temperature rises, the longer the oscillation wavelength.

When measuring using TDLAS, the temperature of the semiconductor laser is adjusted so that the oscillation wavelength of the semiconductor laser is roughly the same as the wavelength band of the optical absorption spectrum to be measured. The temperature of the semiconductor laser is maintained at the adjusted value. Afterward, the injected current of the semiconductor laser is changed, and the oscillation wavelength is finely adjusted.

If the oscillation wavelength of the semiconductor laser matches the wavelength band of the optical absorption spectrum to be measured, the oscillation wavelength of the semiconductor laser is swept in that wavelength band. As illustrated in FIG. 5A, the injected current of the semiconductor laser is swept at this time. For example, the injected current of the semiconductor laser shows a saw-tooth wave.

The semiconductor laser light having a swept oscillation wavelength passes through the measured gas and is collected in a photoreceptor. The photoreceptor outputs an electric signal such as that illustrated in FIG. 5B, reflecting the optical absorption amount for each wavelength of the semiconductor laser light due to the measured gas. At this time, the emission intensity of the semiconductor laser light also changes along with the sweeping of the injected current of the semiconductor laser. For example, the higher the injected current, the higher the emission intensity. Therefore, the electric signal output from the photoreceptor shows a waveform where the dip is superimposed on a saw-tooth wave based on the change in emission intensity that accompanies sweeping of the injected current and the change in optical absorption amount for each wavelength due to the measured gas.

The optical absorption spectrum of the measured gas is calculated based on an electric signal such as that illustrated in FIG. 5B. FIG. 5C is a schematic diagram illustrating the optical absorption spectrum of the calculation results. For example, the optical absorption spectrum is calculated by subtracting the electric signal when not passing through the measured gas from the electric signal when the semiconductor laser light passes through the measured gas and making the horizontal axis a logarithm. The absorption shown by such an optical absorption spectrum is proportional to the component concentration of the measured gas. For example, the area of the optical absorption spectrum is proportional to the component concentration of the measured gas. Therefore, the component concentration of the measured gas can be calculated based on the absorption.

With a laser gas analyzer, the oscillation wavelength of the semiconductor laser is swept across a plurality of wavelengths, and the obtained data is averaged. The sweeping signal for sweeping the oscillation wavelength of the semiconductor laser is generated using a D/A converter. A fixed sweeping pattern is input to the D/A converter so that oscillation wavelengths are continuously swept at the same wavelength range across all cycles.

Here, the D/A converter has a unique nonlinear noise. The nonlinear noise is caused by, for example, DNL (differential non-linearity), INL (integral non-linearity), and the like. Therefore, a nonlinear sweeping signal is output from the D/A converter even if a digital signal having a linear code pattern is input to the D/A converter.

For example, the same nonlinear noise is superimposed on the sweeping signal across all cycles. Because the sweeping pattern is fixed and the same nonlinear noise is superimposed, noise caused by such nonlinear noise does not reduce even when averaging data relating to the optical absorption spectrum across a plurality of cycles.

With TDLAS measurement, an algorithm is formed assuming that the oscillation wavelength is swept in a perfect line, so there is worry that nonlinear noise from the D/A converter will be judged as noise even at the obtained optical absorption spectrum, or will be incorrectly judged as an optical absorption peak. Therefore, it is necessary to understand and correct the nonlinearity of the D/A converter separately during the manufacturing process.

According to a sweeping signal generating device 10 according to one or more embodiments, the nonlinear noise superimposed on the sweeping signal can be changed. Therefore, it is possible to generate a sweeping signal that can contribute to the reduction of noise superimposed on the optical absorption spectrum. Embodiments will mainly be described below referring to attached drawings.

First Embodiment

Figure 1:
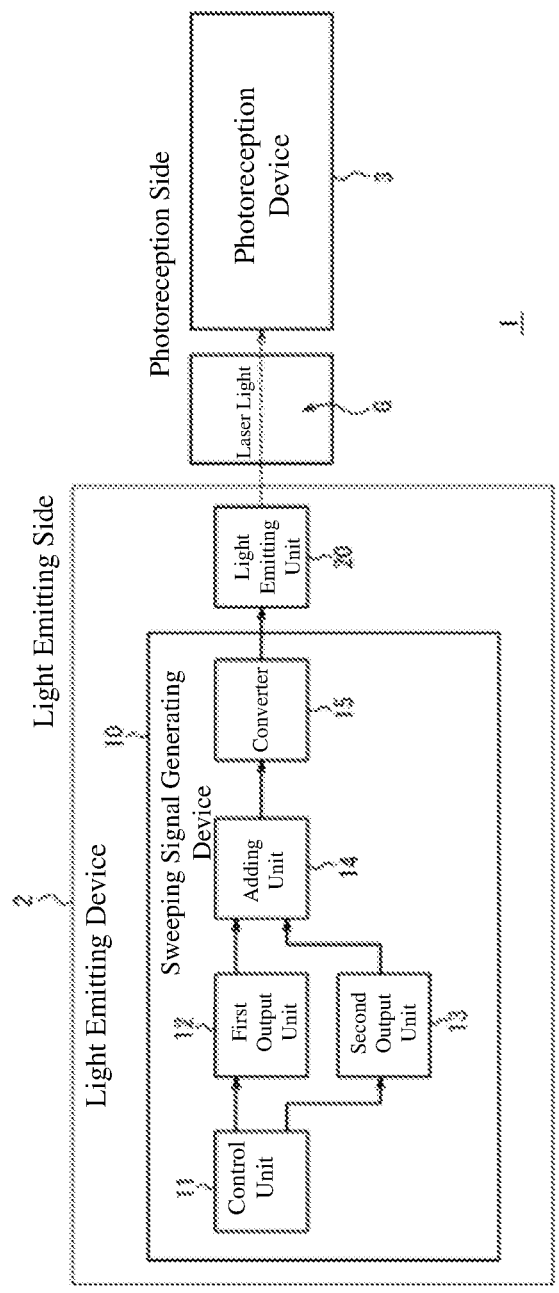
FIG. 1 is a schematic diagram illustrating an example of an optical measuring system including the sweeping signal generating device according to a first embodiment.

FIG. 1 is a schematic diagram illustrating an example of an optical measuring system 1 including the sweeping signal generating device 10 according to a first embodiment. As illustrated in FIG. 1, the optical measuring system 1 includes a light emitting device 2 configuring a light emitting side, and a photoreception device 3 configuring a photoreception side. The photoreception device 2 has a sweeping signal generating device 10 and a light emitting unit 20 connected to the sweeping signal generating device 10. The optical measuring system 1 includes a measured gas G that will be the measurement subject. Light irradiated from the light emitting device 2 passes through the measured gas G and is collected in the photoreception device 3.

The light emitting unit 20 has, for example, any light source that can measure the measured gas G using TDLAS. The light emitting unit 20 has, for example, a semiconductor laser. The light emitting unit 20 irradiates light having a swept oscillation wavelength to the measured gas G based on injected current output from the sweeping signal generating device 10. At this time, the light emitting unit 20 may irradiate light having a swept oscillation wavelength in the same wavelength range across a plurality of cycles.

Gas molecules such as CO, $CO_2$, $H_2O$, CnHm, $NH_3$, and $O_2$, for example, are included as the measured gas G.

The photoreception device 3 has, for example, any light source that can measure the measured gas G using TDLAS. The photoreception device 3 has, for example, a photodiode. The photoreception device 3 detects transmitted light including information relating to the optical absorption spectrum of the measured gas G and converts it into an electric signal. The photoreception device 3 may carry out any processing on the obtained electric signal. For example, the photoreception device 3 may average the obtained electric signal across a plurality of cycles. For example, the photoreception device 3 may calculate the optical absorption spectrum from the obtained electric signal.

The sweeping signal generating device 10 has a control unit 11 (controller), a first output unit 12 (first converter), a second output unit 13 (second converter), an adding unit 14 (adder circuit), and a converter 15 (converter circuit). The sweeping signal generating device 10 is connected to the light emitting unit 20, and outputs injected current which will have its oscillation wavelength swept to the light emitting unit 20.

The control unit 11 includes one or more processors. For example, the control unit 11 includes any processor such as a dedicated processor specializing in processing the sweeping signal generating device 10. The control unit 11 is respectively connected to the first output unit 12 and the second output unit 13, and controls and manages these. For example, the control unit 11 outputs a control signal to the first output unit 12 so that the first output unit 12 outputs a sweeping signal, which will be described hereafter. For example, the control unit 11 outputs a control signal to the second output unit 13 so that the second output unit 13 outputs an offset signal, which will be described hereafter.

The first output unit 12 includes a D/A converter that converts digital signals output from the control unit 11 into analog signals. For example, the first output unit 12 acquires a control signal output from the control unit 11 and outputs a sweeping signal. Here, the sweeping signal includes, for example, sweep voltage. The first output unit 12 includes, for example, a D/A converter having a sufficiently high sampling rate that is compatible with the frequency band of such sweep voltage.

The second output unit 13 includes a D/A converter that converts digital signals output from the control unit 11 into analog signals. For example, the second output unit 13 acquires a control signal output from the control unit 11 and outputs an offset signal. Here, the offset signal includes, for example, constant voltage. The second output unit 13 includes, for example, a D/A converter having a sampling rate that can be compatible with output of such an offset signal.

For example, a portion of the mutual specifications between the D/A converter configuring the first output unit 12 and the D/A converter configuring the second output unit 13 may be the same, so that the oscillation wavelength of the semiconductor laser is swept in a similar manner across a plurality of cycles. This portion of specifications includes, for example, variable range of output voltage and resolution, and the like. On the contrary, a portion of the mutual specifications between the D/A converter configuring the first output unit 12 and the D/A converter configuring the second output unit 13 may differ. This portion of specifications includes, for example, sampling rate and the like. More specifically, the sampling rate of the D/A converter configuring the second output unit 13 may be lower than the sampling rate of the D/A converter configuring the first output unit 12. It is therefore possible to use an inexpensive D/A converter in the second output unit 13, and reduce costs.

The adding unit 14 includes any adder circuit. The adding unit 14 outputs an added signal which adds the sweeping signal output from the first output unit 12 and the offset signal output from the second output unit 13. For example, the adding unit 14 outputs an added voltage which adds the sweep voltage output from the first output unit 12 and the constant voltage output from the second output unit 13.

The converter 15 includes any voltage/current converter circuit. The converter 15 converts the voltage/current state of the added signal output from the adding unit 14. For example, the converter 15 converts the added voltage of the sweep voltage from the first output unit 12 and the constant voltage from the second output unit 13, output from the adding unit 14, to injected current for sweeping the oscillation wavelength of the semiconductor laser.

Figure 2A:
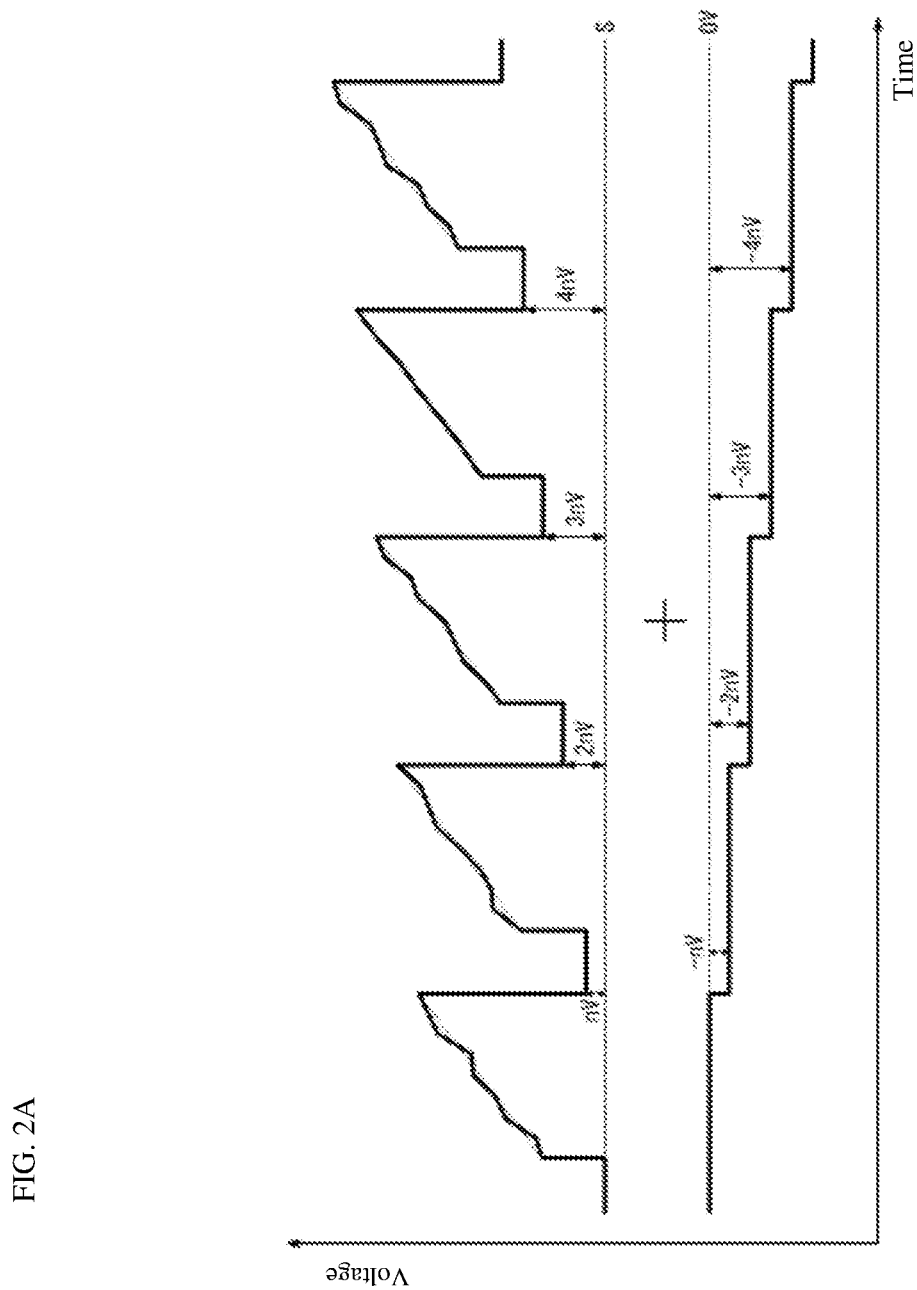
FIG. 2A is a schematic diagram illustrating a state wherein output signals from a first output unit and a second output unit in FIG. 1 are added using an adding unit.

FIG. 2A is a schematic diagram illustrating a state wherein output signals from the first output unit 12 and the second output unit 13 in FIG. 1 are added using the adding unit 14.

For example, the control unit 11 controls the first output unit 12 and the second output unit 13 to respectively output the sweeping signal and offset signal mutually at the same cycle across a plurality of cycles. At this time, nonlinear noise is superimposed on the sweeping signal output from the first output unit 12 across all cycles. Meanwhile, for example, when the sampling rate of the D/A converter configuring the second output unit 13 is sufficiently lower than the sampling rate of the D/A converter configuring the first output unit 12, the nonlinear noise superimposed on the offset signal output from the second output unit 13 is sufficiently small when compared to the nonlinear noise superimposed on the sweeping signal. Therefore, the nonlinear noise superimposed on the offset signal output from the second output unit 13 will be ignored below.

At this time, the first output unit 12 outputs a sweeping signal with only a first offset value added from a sweeping standard level S based on a control signal from the control unit 11. More specifically, the first output unit 12 outputs sweeping signals having a different first offset value for each cycle across a plurality of cycles. At this time, the difference between the first offset value in one cycle and the first offset value in a cycle following this one cycle may be constant across the plurality of cycles.

More specifically, the first output unit 12 outputs a normal sweeping signal in the first sweep, such as one wherein the first offset value is 0 V. In the second sweep, the first output unit 12 outputs a sweeping signal such as one wherein the first offset value as one wherein the first offset value is 2 nV. In the fourth sweep, the first output unit 12 outputs a sweeping signal such as one wherein the first offset value is 3 nV. In the fifth sweep, is nV. Here, n includes any positive number. In the third sweep, the first output unit 12 outputs a sweeping signal such the first output unit 12 outputs a sweeping signal such as one wherein the first offset value is 4 nV. Similarly below, the first output unit 12 continuously outputs sweeping signals with nV added to the first offset value of the previous cycle.

Meanwhile, the second output unit 13 outputs an offset signal having a second offset value corresponding to the first offset value based on a control signal from the control unit 11. More specifically, the second output unit 13 outputs offset signals having a second offset value such as one that is the same as the standard level S when added to the first offset value for each cycle across a plurality of cycles. At this time, the difference between the second offset value in one cycle and the second offset value in a cycle following this one cycle may be constant across the plurality of cycles.

More specifically, the second output unit 13 outputs an offset signal in the first sweep, such as one wherein the second offset value is 0 V. In the second sweep, the second output unit 13 outputs an offset signal such as one wherein the second offset value is −nV. In the third sweep, the second output unit 13 outputs an offset signal such as one wherein the second offset value is −2 nV. In the fourth sweep, the second output unit 13 outputs an offset signal such as one wherein the second offset value is −3 nV. In the fifth sweep, the second output unit 13 outputs an offset signal such as one wherein the second offset value is −4 nV. Similarly below, the second output unit 13 continuously outputs offset signals with −nV added to the second offset value of the previous cycle.

Generally, the output voltage of the D/A converter configuring the first output unit 12 and the output voltage of the D/A converter configuring the second output unit 13 are respectively limited, and have an upper limit value. Therefore, when the output voltage of each D/A converter seems to saturate, the control unit 11 may return the first offset value and second offset value to 0V before saturating, make the starting point of the sweeping signal the same as the standard level S yet again, and make the starting point of the offset signal the same as 0 V yet again. Then, the control unit 11 may continue the control described above relating to the first offset value and the second offset value.

The adding unit 14 outputs an added signal which adds the sweeping signal output from the first output unit 12 in one cycle and the offset signal output from the second output unit 13 in the same cycle across a plurality of cycles.

Figure 2B:
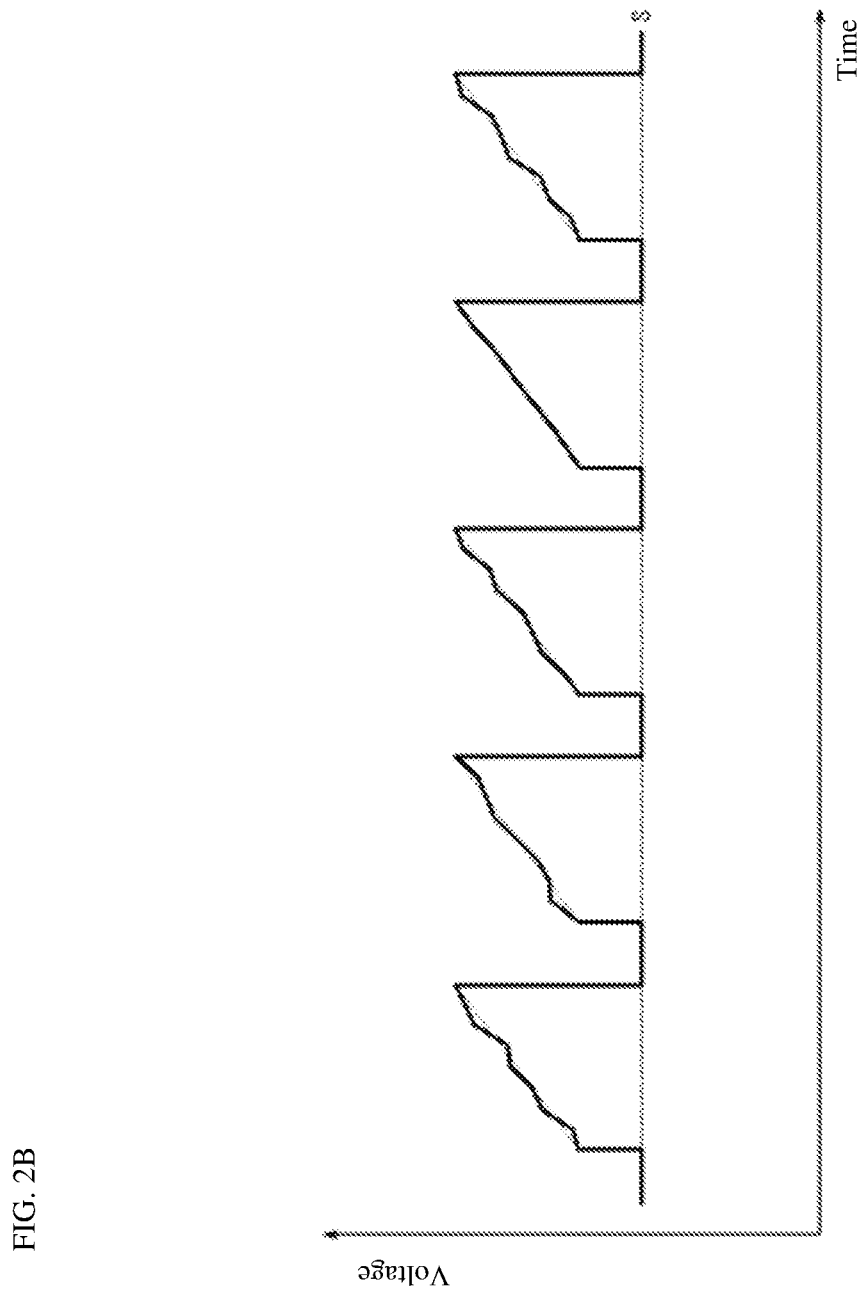
FIG. 2B is a schematic diagram illustrating an added signal output from the adding unit based on the output signals in FIG. 2A.

FIG. 2B is a schematic diagram illustrating an added signal output from the adding unit 14 based on the output signals in FIG. 2A.

The code pattern input to the first output unit 12 differs for each cycle due to the control unit 11 controlling the first output unit 12 to output a sweeping signal displaced from the sweeping standard level S by the amount of the first offset value. The difference between the ideal linearity and the actual linearity of the output signal differs depending on the code pattern based on the nonlinearity of the D/A converter. Therefore, the pattern of the nonlinear noise superimposed on the sweeping signal output from the first output unit 12 differs for each cycle. That is, the phase pattern of the nonlinear noise superimposed on the added signal is mutually different in each cycle.

The starting point in each cycle of the sweeping signal displaced by the amount of the first offset value can be made the same as the standard level S by the control unit 11 controlling the second output unit 13 to output an offset signal of the second offset value and the sweeping signal and offset signal being added in the adding unit 14. Therefore, the adding unit 14 can output an added signal swept in the same sweeping range in each cycle.

Figure 2C:
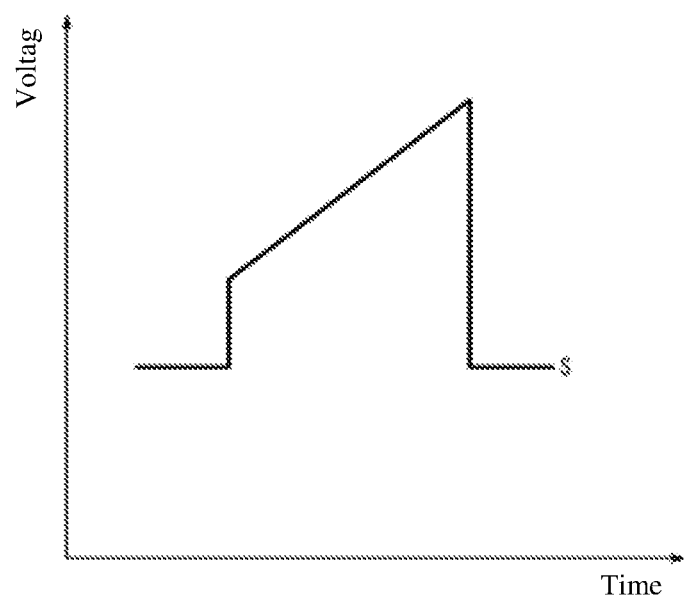
FIG. 2C is a schematic diagram illustrating the added signal in FIG. 2B averaged across a plurality of cycles.

FIG. 2C is a schematic diagram illustrating the added signal in FIG. 2B averaged across a plurality of cycles.

As described above, the adding unit 14 outputs an added signal wherein the pattern of nonlinear noise differs for each cycle while having the same sweeping range in each cycle. Therefore, nonlinear noise acts like random noise, so the nonlinear noise in each cycle is mutually negated if the added signals are averaged across all cycles, and nonlinear noise in the added signals is reduced.

The sweeping signal generating device 10 outputs injected current to the light emitting unit 20 based on an added signal such as that in FIG. 2B, and sweeps the oscillation wavelength thereof. Light irradiated from the light emitting unit 20 is detected in the photoreception device 3 as transmitted light that has passed through the measured gas G, and is converted to an electric signal. The obtained electric signal includes noise based on the nonlinear noise described above for each cycle, in addition to information relating to the optical absorption spectrum. However, because the pattern of nonlinear noise differs for each cycle, the pattern of noise superimposed on the electric signal obtained in the photoreception device 3 also differs for each cycle. Therefore, noise superimposed on the optical absorption spectrum is reduced by averaging the electric signals obtained in the photoreception device 3 across a plurality of cycles.

In this manner, according to the sweeping signal generating device 10 according to the first embodiment, the nonlinear noise superimposed on the sweeping signal can be changed. Therefore, the sweeping signal generating device 10 can generate a sweeping signal that can contribute to the reduction of noise superimposed on the optical absorption spectrum. The accuracy of spectrometry improves when the noise superimposed on the optical absorption spectrum is reduced. Additionally, it is examined as to whether the level of such noise superimposed on the electric signal obtained in the photoreception device 3 is a prescribed threshold or less, and such examination conditions are easily fulfilled when the sweeping signal generating device 10 or light emitting device 2 is shipped as a product. Therefore, the manufacturing efficiency of the product improves.

In the first embodiment, it was described that the first output unit 12 outputs a sweeping signal with only a first offset value added from the sweeping standard level S based on a control signal from the control unit 11, but it is not limited to this. The first output unit 12 may output a sweeping signal with only a first offset value subtracted from the sweeping standard level S.

In the first embodiment, an example was described wherein the first offset value of the sweeping signal output from the first output unit 12 is controlled to change uniformly across a plurality of cycles, but the method for controlling the first offset value is not limited to this. For example, the control unit 11 may control the first output unit 12 so that the first offset value randomly differs across a plurality of cycles.

In the first embodiment, an example was described wherein the first offset value of the sweeping signal output from the first output unit 12 is controlled to increase uniformly across a plurality of cycles, but the method for controlling the first offset value is not limited to this. For example, the control unit 11 may control the first output unit 12 so that the first offset value uniformly decreases. At this time, the control unit 11 may control the second output unit 13 so that the second offset value uniformly increases.

Second Embodiment

Figure 3:
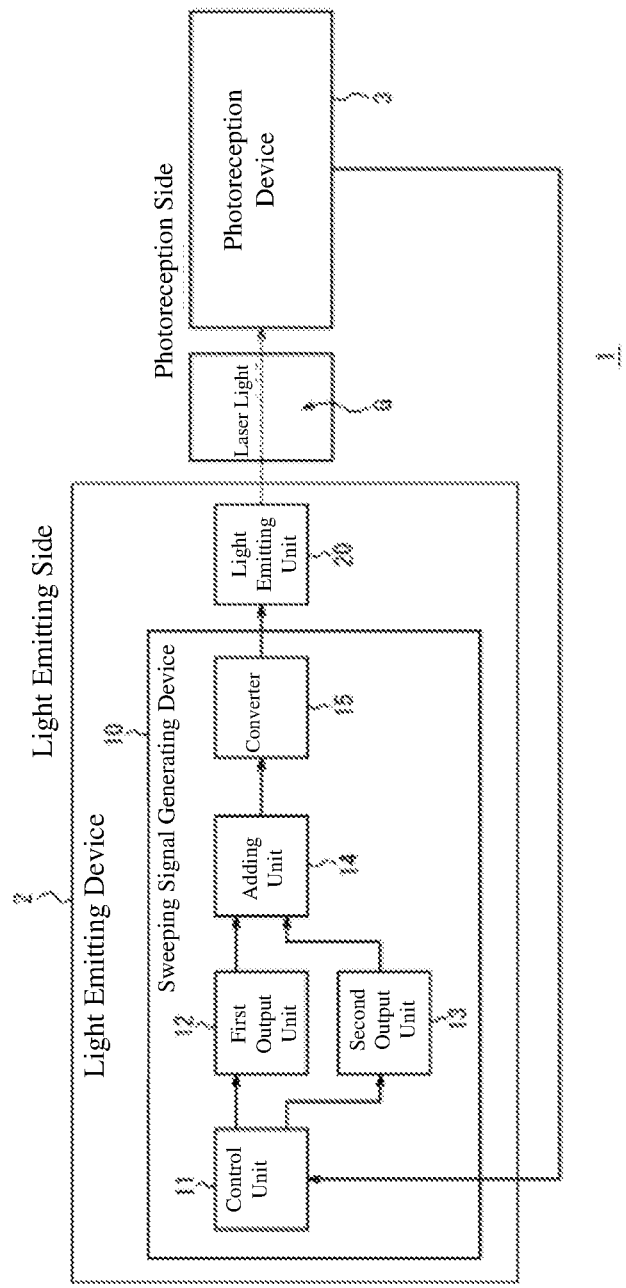
FIG. 3 is a schematic diagram illustrating an example of an optical measuring system including the sweeping signal generating device according to a second embodiment.

FIG. 3 is a schematic diagram illustrating an example of an optical measuring system 1 including the sweeping signal generating device 10 according to a second embodiment. The configuration and functions of the sweeping signal generating device 10 according to the second embodiment will mainly be described below referring to FIG. 3. Components that are similar to the first embodiment will be given the same reference numerals, and the details thereof will be omitted. Differences from the first embodiment will be mainly described.

For example, the control unit 11 of the sweeping signal generating device 10 according to the second embodiment determines the nonlinearity of the sweeping signal caused by nonlinear noise superimposed on the sweeping signal. More specifically, the control unit 11 determines the extent of the nonlinearity of the sweeping signal. For example, the control unit 11 acquires, from the photoreception device 3, detection information when the photoreception device 3 detects a state wherein light irradiated from the light emitting device 2 has not passed through the measured gas G based on any first offset value and second offset value. For example, the light irradiated from the light emitting device 2 passes through a gas cell for correction, which does not include any measured gas G, which will be the measurement subject, and is detected by the photoreception device 3. The control unit 11 acquires, from the photoreception device 3, an electric signal on which a process similar the calculation of the optical absorption spectrum is carried out based on such conditions. The electric signal at this time may show, for example, a waveform such as one wherein noise is superimposed on a sawtooth wave not including a dip such as that illustrated in FIG. 5B, and may show a waveform such as one wherein noise is superimposed at a constant voltage not including a dip such as that illustrated in FIG. 5C. The control unit 11 calculates information relating to noise superimposed on an acquired electric signal. The information relating to noise includes any information, such as, for example, a maximum value of a noise level, an average value of a noise level, DNL, and INL. The control unit 11 determines the extent of nonlinearity of a sweeping signal by calculating such information relating to noise. For example, the control unit 11 determines that the nonlinearity of the sweeping signal is smaller the smaller the information relating to noise is.

For example, the control unit 11 changes the first offset value and second offset value, and judges whether the nonlinearity of the sweeping signal is as small as possible. The control unit 11 determines the first offset value and second offset value so that the nonlinearity is as small as possible. For example, the control unit 11 determines the first offset value and second offset value so that the information relating to noise described above is as small as possible. At this time, the control unit 11 controls the first output unit 12 so that a sweeping signal having the determined first offset value is output over one or more cycle. At this time, the control unit 11 controls the second output unit 13 so that an offset signal having the determined second offset value is output over one or more cycle.

In this manner, in the sweeping signal generating device 10 according to the second embodiment, the first output unit 12 differs from the first embodiment in that it outputs a sweeping signal having a first offset value that is the same across one or more cycle. Similarly, the second output unit 13 outputs an offset signal having a second offset value that is the same across one or more cycle.

According to such a sweeping signal generating device 10 according to the second embodiment, the nonlinear noise superimposed on the sweeping signal can be changed, and a sweeping signal can be generated that can contribute to the reduction of noise superimposed on the optical absorption spectrum similar to the first embodiment. Additionally, according to the sweeping signal generating device 10 according to the second embodiment, the repetition of sweeping is easily maintained. For example, when the first offset value and second offset value are different for each cycle, and the characteristics and the like of the D/A converters that respectively configure the first output unit 12 and the second output unit 13 are different, there is fear that the absolute value of the first offset value and the absolute value of the second offset value will be different depending on the cycle, and the added signal is displaced from the standard level S. At this time, the sweeping range of the oscillation wavelength is displaced every cycle, and the repetition of the sweeping is no longer maintained. According to the sweeping signal generating device 10 according to the second embodiment, the repetition of sweeping is easily maintained because the first offset value and second offset value are respectively the same for each cycle.

In the second embodiment, an example was described wherein the control unit 11 changes the first offset value and second offset value, and judges whether the nonlinearity of the sweeping signal is as small as possible, but the judging method is not limited to this. For example, the control unit 11 may change the first offset value and second offset value, and judge whether the nonlinearity of the sweeping signal is smaller than the nonlinearity when at the standard level S. At this time, the control unit 11 may determine any first offset value and second offset value so that the nonlinearity of the sweeping signal is smaller than the nonlinearity when at the standard level S.

In the second embodiment, it was described as though the control unit 11 determines the nonlinearity of the sweeping signal that is caused by nonlinear noise superimposed on the sweeping signal, and the control unit 11 judges whether the nonlinearity of the sweeping signal is as small as possible, but the component for determining and judging is not limited to this. For example, the photoreception device 3 may similarly carry out determining and judging. At this time, the control unit 11 acquires, from the photoreception device 3, information relating to the determining and judging carried out in the photoreception device 3.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

For example, the arrangement, number, and the like of each component described above are not limited to the content illustrated in the descriptions above and the drawings. The arrangement, number, and the like of each component can be configured in any manner as long as they can realize the function thereof.

In the first embodiment and second embodiment, it was described that the sweeping signal generating device 10 configures the one light emitting device 2 along with the light emitting unit 20, but the configuration method is not limited to this. The sweeping signal generating device 10 and the light emitting unit 20 may be configured as mutually different devices.

In the first embodiment and second embodiment, it was described that the injected current is changed to sweep the oscillation wavelength of the light emitting unit 20, but the sweeping method of the oscillation wavelength is not limited to this. For example, the oscillation wavelength may be swept by controlling the diffraction grating and a piezoelectric element attached to the resonator and the like in an external resonator semiconductor laser. At this time, the sweeping signal generating device 10 may omit the converter 15 and directly output not current, but voltage.

In the first embodiment and second embodiment, it was described such that the added voltage output from the adding unit 14 is used for sweeping the oscillation wavelength of the laser, but the present disclosure is not limited to this. Added voltage may be used for sweeping the wavelength of any light source. Light irradiated from such a light source may include, for example, incoherent light having a wideband optical spectrum. At this time, the added voltage may be used to sweep the center wavelength of a tunable filter that extracts only a wavelength region of a portion of the optical spectrum of this light.

In the first embodiment and second embodiment, the description was limited to TDLAS, but the sweeping signal generating device 10 can be applied to any analyzer that analyzes any measurement subject based on a repeated sweeping signal, and any other device that uses a repeated sweeping signal.

What is claimed is:

1. A sweeping signal generating device, comprising:
    a first converter that outputs a sweeping signal having a first offset value added to or subtracted from a sweeping standard level;
    a second converter that outputs an offset signal having a second offset value corresponding to the first offset value; and
    an adder circuit that adds the sweeping signal output from the first converter and the offset signal output from the second converter.

2. The sweeping signal generating device according to claim 1,
    wherein the first converter outputs sweeping signals over a plurality of cycles,
    wherein the second converter outputs offset signals having a second offset value such as one that is the same as the standard level when added to the first offset value for each cycle across a plurality of cycles,
    wherein each of the sweeping signals has a different first offset value for each of the plurality of cycles,
    wherein each of the offset signals has a second offset value for each of the plurality of cycles, and
    wherein the second offset value and the first offset value add up to a standard level.

3. The sweeping signal generating device according to claim 2, wherein a difference between the first offset value in a first cycle and the first offset value in a second cycle following the first cycle is constant across the plurality of cycles.

4. The sweeping signal generating device according to claim 1, further comprising:
    a controller that determines the first offset value and the second offset value so that nonlinearity of each of the sweeping signals caused by nonlinear noise superimposed on each of the sweeping signals is smaller than nonlinearity when at a standard level,
    wherein the first converter outputs the sweeping signal having the first offset value determined by the controller across at least one cycle, and
    wherein the second converter outputs the offset signal having the second offset value determined by the controller across the at least one cycle.

5. The sweeping signal generating device according to claim 1
    wherein the sweeping signal includes sweep voltage,
    wherein the offset signal includes constant voltage, and wherein added voltage of the sweep voltage and constant voltage output from the adder circuit is used for sweeping a wavelength of a light source.

6. The sweeping signal generating device according to claim 5, further comprising:
a converter circuit that converts the added voltage into injected current for sweeping an oscillation wavelength of a laser.

7. The sweeping signal generating device according to claim 2,
wherein each of the sweeping signals includes sweep voltage,
wherein each of the offset signals includes constant voltage, and
wherein added voltage of the sweep voltage and constant voltage output from the adder circuit is used for sweeping a wavelength of a light source.

8. The sweeping signal generating device according to claim 7, further comprising:
a converter circuit that converts the added voltage into injected current for sweeping an oscillation wavelength of a laser.

9. The sweeping signal generating device according to claim 3,
wherein each of the sweeping signals includes sweep voltage,
wherein each of the offset signals includes constant voltage, and
wherein added voltage of the sweep voltage and constant voltage output from the adder circuit is used for sweeping a wavelength of a light source.

10. The sweeping signal generating device according to claim 9, further comprising:
a converter circuit that converts the added voltage into injected current for sweeping an oscillation wavelength of a laser.

11. The sweeping signal generating device according to claim 4,
wherein the sweeping signal includes sweep voltage,
wherein the offset signal includes constant voltage, and
wherein added voltage of the sweep voltage and constant voltage output from the adder circuit is used for sweeping a wavelength of a light source.

12. The sweeping signal generating device according to claim 11, further comprising:
a converter circuit that converts the added voltage into injected current for sweeping an oscillation wavelength of a laser.

* * * * *